Figure 1:
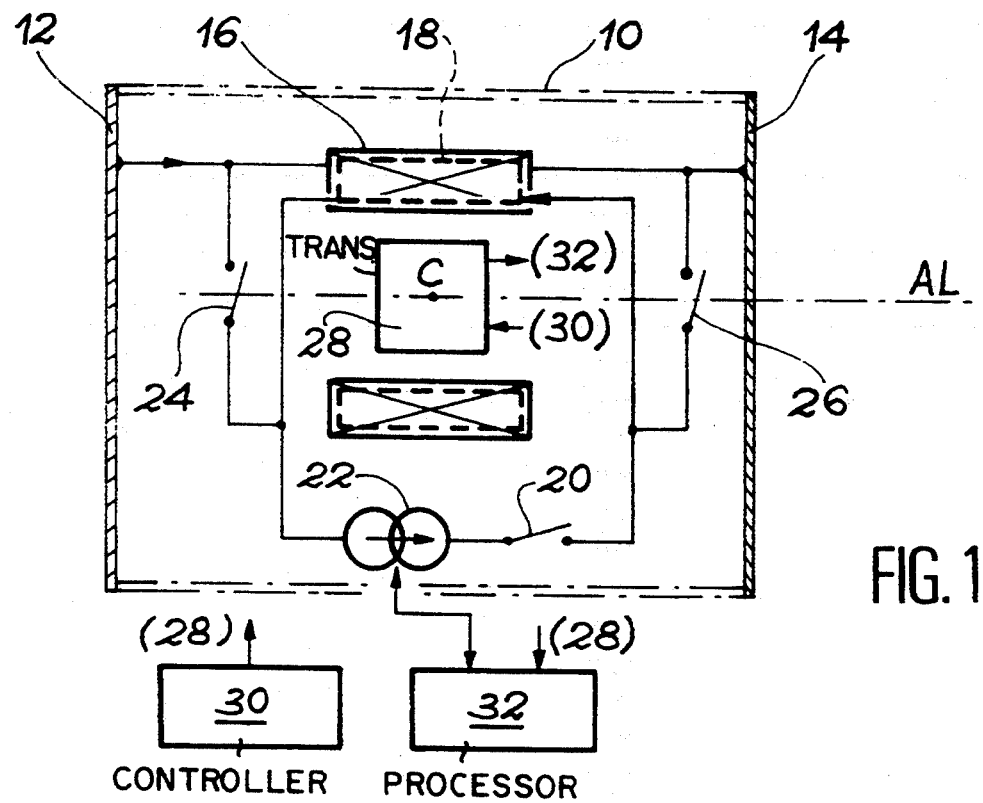

United States Patent [19]

Blanpain et al.

[11] Patent Number: 5,440,226

[45] Date of Patent: Aug. 8, 1995

[54] PROCESS AND APPARATUS USING MAGNETIC FIELD MEASUREMENTS FOR MEASURING AN ELECTRIC FIELD IN A CONDUCTIVE MEDIUM

[75] Inventors: Roland Blanpain, Entre-Deux-Guiers; Francis Robach, Biviers, both of France

[73] Assignee: Commissariat a l'Energie Atomique, France

[21] Appl. No.: 135,306

[22] Filed: Oct. 12, 1993

[51] Int. Cl.⁶ .................. G01R 29/12; G01R 19/00; G01R 15/00; G01V 3/08
[52] U.S. Cl. ............................ 324/72; 324/348; 324/457
[58] Field of Search ............... 324/326, 345, 348–351, 324/365, 425, 439, 445, 446, 449, 450, 457, 71.1, 71.2, 72, 92, 204

[56] References Cited

U.S. PATENT DOCUMENTS 3,641,427  2/1972  Pittman et al. .

FOREIGN PATENT DOCUMENTS 2575296  12/1984  France .
2212621   7/1989  United Kingdom .

OTHER PUBLICATIONS

Revue Generale de l'Electricite, J. P. Etter "Methods Modernes de Mesure des Courants". Le Capteur LEM, May 1984, pp. 283–287.

Primary Examiner—Gerard R. Strecker
Attorney, Agent, or Firm—Cesari and McKenna

[57] ABSTRACT

The apparatus includes a pair of electrodes which makes it possible to channel a current density creating the current which induces a magnetic field in one or more induction coils. This magnetic field is measured with the aid of one or more magnetometric transducers. The electric/magnetic transfer rate of the coils and the conductivity of the conductive medium are known, so that the value of the electric field is deduced on the basis of Ohm's law. The local magnetic field is previously measured so as to take account thereof when measuring the induced magnetic field.

9 Claims, 2 Drawing Sheets

PROCESS AND APPARATUS USING MAGNETIC FIELD MEASUREMENTS FOR MEASURING AN ELECTRIC FIELD IN A CONDUCTIVE MEDIUM

DESCRIPTION

The present invention relates to a process and an apparatus for measuring an electric field in a conductive medium. It more particularly applies to underwater electromagnetic measurements.

A first apparatus for measuring an electric field in the ocean using transoceanic telephone cables is known. Two impolarizable electrodes, constituted by a silver sheet would in a porous ceramic tube filled with silver chloride in powder form, are connected with the aid of a conductive cable having a given length. The potential difference between these electrodes is measured and from it is deduced the electric field.

This type of apparatus is described in articles by Cox et al, J. of Geophysical Res., vol. 83, p. 431, 20.1.1978 and Filloux, Physics of the Earth and Planetary Interiors, vol. 7, pp. 323328, 1973.

In such an apparatus, only a very small part of the current propagating in the conductive medium constituted by the ocean water is deflected into the measuring apparatus. The exploitation of a very small part ($10^{-6}$ of the total current) of the energy of the signal causes metrology problems (amplifier drift). In addition, these electrodes have a very low background noise, but are affected by a slow drift electrochemistry), which it is necessary to clear and this makes the exploitation of the measurements performed more difficult.

Another type of apparatus for measuring an electric field is known, which determines the current density J produced in a fixed conductive medium volume whose resistivity is assumed to be known. The electric field E is deduced from Ohm's law:

$$E = \rho J.$$

Such an apparatus is e.g. described in the thesis by M. Urbain Rakotosoa entitled "Measuring apparatus for very weak electromagnetic fields in a marine medium; application to showing electromagnetic signals induced in the ocean", Paris University 6, 20.12.1985. A volume of the conductive medium is replaced by a volume of insulating medium, e.g. by immersing an insulating enclosure in the ocean. Two electrodes are placed outside the enclosure and make it possible to channel the current density. These electrodes are connected to the primary winding of a toroidal transformer connected to a servo amplifier and to an output amplifier.

If the impedance of the measuring system is equivalent to that of the substituted water surface, the measured channelled current I is equal to:

$$I = S \cdot J$$

in which S is the surface of an electrode. Therefore the measurement is independent of the interelectrode distance which is the opposite to the situation in the previous apparatus. Thus, the electric field is deduced knowing J and $\rho$.

However, this apparatus, which uses a transformer for measuring the current, operates poorly in the case of frequencies below a few hertz (Hz). However, it is found that when used in a marine medium, the studied phenomena (e.g. ocean water movements) have a passband below 1 Hz and which can even extend to $10^{31}$ $10$ Hz, which corresponds to "continuum" compared with the measurement times.

The present invention obviates the disadvantages of the prior art procedures. In the present invention the measurement using the channelling of the current density is performed with a compact apparatus, whose sensitivity is independent of the interelectrode distance.

The invention also makes it possible to measure signals in a passband ranging from the continuum to a few kHz.

More specifically, the present invention relates to a process for measuring an electric field in a conductive medium incorporating the following steps:

A) a current density traversing a volume of the conductive medium is channelled,
B) a magnetic field is induced on the basis of said channelled current density,
C) said induced magnetic field is measured, and
D) the electric field prevailing in the considered conductive medium is deduced from the measurement of said induced magnetic field, Moreover, prior to step A, the local magnetic field and/or its local gradient are measured (spatial derivatives of the field) and for measuring the magnetic field induced by said current density (step C), a) the value of the total induced magnetic field or of the gradient of the total magnetic field is measured and, b) the induced magnetic field or the gradient of the induced magnetic field is compensated by the induction of an identical magnetic field of the opposite direction, so as to find the value of the local magnetic field only, or the gradient of the local magnetic field.

The prior measurement of the local magnetic field, due to the earth's magnetic field and to any other external source, increases the accuracy of the electric field determination. It is also possible to obtain in a manner which can be looked upon as simultaneous on referring to the characteristic durations of the phenomena observed (from 1 second to $10^{10}$ seconds), the time variation of the local magnetic field, as well as that of the electric field.

The invention also relates to an apparatus for measuring an electric field in a conductive medium comprising an insulating enclosure, means for channelling a current density which are integral with the enclosure, at least one first coil connected to the current density channelling means, said coil having a known electric/magnetic transfer rate, at least one first magnetometric transducer located within said first coil, means for controlling said magnetometric transducer and means for analysis and processing connected to the magnetometric transducer in order to at least determine an electric field.

According to a special embodiment, the apparatus comprises a second magnetometric transducer positioned in the vicinity of the first magnetometric transducer and connected to the analysis and processing means, said analysis and processing means being able to form a difference between the measurements performed by the first and second magnetometric transducers and the control means of said second magnetometric transducer.

The magnetometric transducers can be of all known types and are advantageously nuclear magnetic resonance (NMR) transducers. Each of them can contain one or more magnetic material envelopes and can be used in accordance with any known arrangement, i.e. as a nuclear oscillator, nuclear filter or even in mixed form. It is also possible to use electronic paramagnetic resonance (EPR) transducers or Squid or any other type.

According to a variant, the apparatus comprises a second coil having the same longitudinal axis and same geometrical center as the first coil, so that it creates an identical magnetic field, but having the opposite sense to the field created by the first coil when an identical current flows through said coils, a randomly variable power supply connected to the second coil and connection means for the random parallel connection of the first and second coils.

According to another variant, the apparatus comprises a second coil having the same longitudinal axis and the same geometrical center as the first coil, so that it creates an identical magnetic field, but having the opposite sense to the field created by the first coil when an identical current flows through said coils, a third coil able to create an identical magnetic field, but having the opposite sense to the magnetic field created by the first coil when an identical current flows through said coils, said third coil being connected in series, on the one hand, to the first coil and on the other, to the channelling means, a fourth coil having the same longitudinal axis and the same geometrical center as the third coil and able to create an identical magnetic field, but having the opposite sense to the magnetic field created by the third coil when an identical current flows through said coil, said fourth coil being connected in series to the second coil, connection means for the parallel connection, as desired, of the assembly formed by the first and third coils to the assembly formed by the second and fourth coils and a randomly variable power supply connected, on the one hand, to the second coil and, on the other, to the fourth coil.

Advantageously, in said second variant, the second transducer is placed within the third coil.

The transducers can be alternately switched, the analysis and processing means then having synchronous detection means at the switching frequency.

The apparatus involved here only makes it possible to determine the electric field in accordance with a single component (in the axis of the channelling means).

The present invention also relates to an apparatus for measuring an electric field in a conductive medium in accordance with two or more components.

Among the advantages of the present invention reference can be made to the compactness, because an enclosure containing a set of coils may represent less than 100 dm$^3$. The measurement can be performed in a wide passband (0 to a few kHz) using EPR magnetometric transducers, Squid, etc.

Measurement is possible in the ultralow frequency or ULF band of 0 to 1 Hz with a very great sensitivity using NMR magnetometric transducers.

Moreover, in an apparatus according to the invention, it is possible to regulate the electric/magnetic transfer rate by choosing the number of turns of the coils, as well as their construction.

Finally, a single apparatus makes it possible to simultaneously determine (on comparing the durations required for the measurement with the evolution times of the magnetic and electric fields) the local magnetic field and the electric field in the conductive medium. These determinations are also extremely reliable, because they are based on magnetometric transducers (either EPR, NMR or Squid), whose reliability and stability have been proved.

Figure 2:
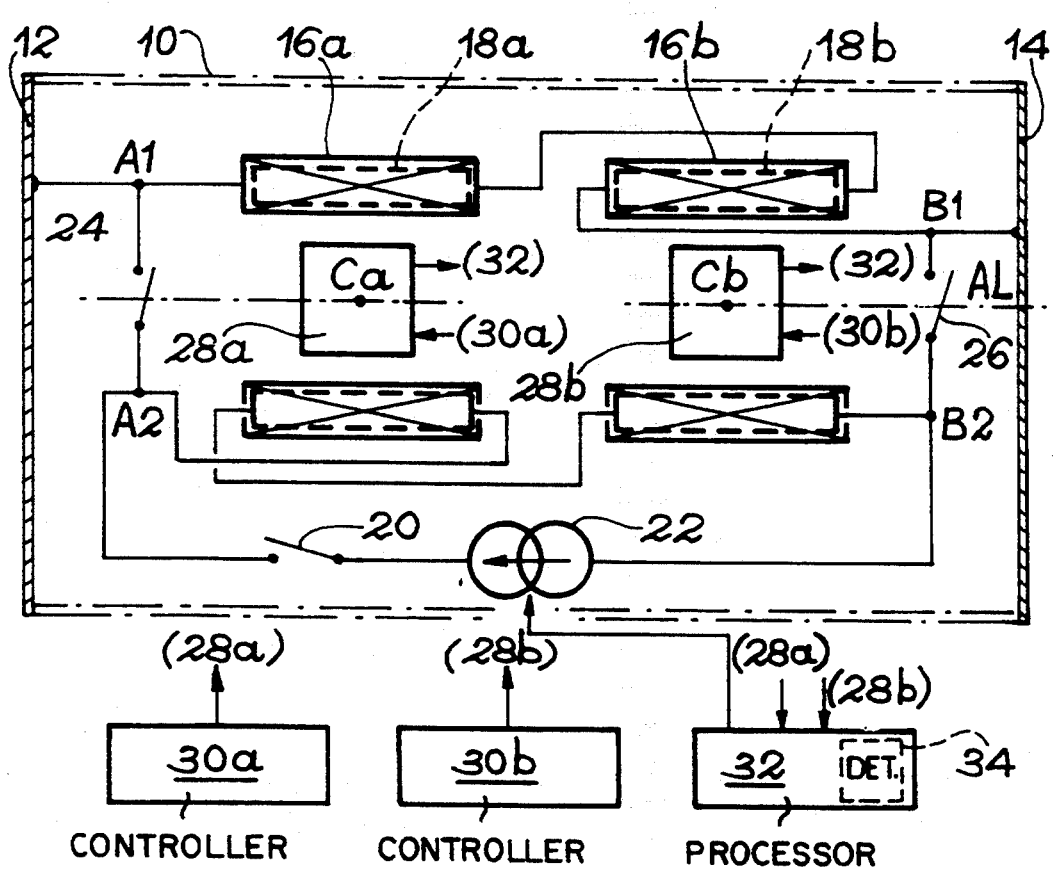
Figure 3:
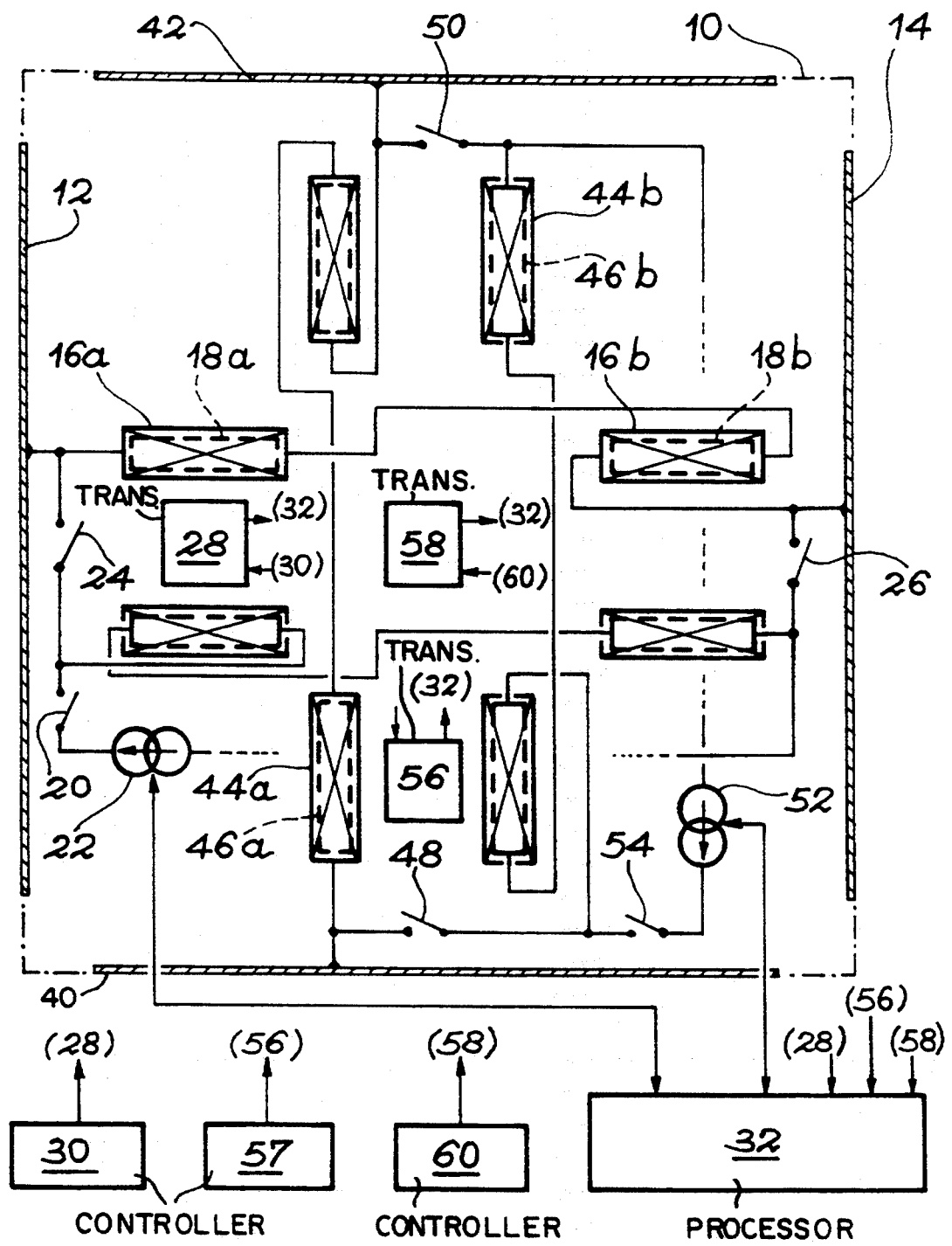

The invention is described in greater detail hereinafter relative to non-limitative embodiments and with reference to the attached drawings, wherein show:

FIG. 1 diagrammatically a first embodiment of an apparatus according to the invention;

FIG. 2 diagrammatically another embodiment of an apparatus according to the invention, and FIG. 3 diagrammatically another embodiment of an apparatus according to the invention and making it possible to determine two perpendicular components of an electric field.

With reference to FIG. 1, a description will now be given of a first embodiment of an apparatus according to the invention. Means for channelling a current density are placed on an e.g. cylindrical, insulating enclosure 10. These channelling means are constituted by two, e.g. disk-shaped electrodes 12,14, placed on the two opposite faces of the enclosure 10 and connected to the measuring apparatus therein.

A first coil 16 is connected in series to the electrodes 12 and 14, said coil 16 having a known electric/magnetic transfer rate. The apparatus shown in FIG. 1 comprises a second coil 18 having the same longitudinal axis AL and the same geometrical center C as the first coil 16. Traversed by an identical current, said coils 16,18 produce identical magnetic fields, but having the opposite sense. These coils can be produced from an e.g. aluminium, divided wire winding, half the strands constituting the first coil 16 and the other half the second coil 18. These coils can be in layer form and can even be constituted by several windings interconnected in parallel. It is therefore possible to accurately regulate the electric/magnetic transfer rate.

The second coil 18 is connected by means of a switch 20 to a randomly variable power supply 22. In addition, connection means, constituted by two switches 24,26, permit the parallel connection of the first and second coils.

A magnetometric transducer 28 is placed within the coils 16,18 at center C. It is connected to control means 30, which inter alia supply the excitation signals necessary for the operation of the transducer, as well as to analysis and processing means 32 making it possible to determine an electric field on the basis of the magnetic field measurement.

A description will now be given of a method for using this apparatus for determining an electric field in an e.g. oceanic conductive medium. The insulating enclosure 10 is immersed in the conductive medium and is positioned along the axis of the field which it is wished to measure. The axis connecting the electrodes determines the direction of the given electric field component.

The current density propagating in the water volume replaced by the enclosure 10 is channelled by means of the electrodes 12,14. For a good channelling, the internal impedance of the apparatus is advantageously equal to the impedance of the conductive medium. Therefore, the current lines are not disturbed by the replacement of the water volume by the enclosure 10. This impedance matching is obtained through the choice of the electrodes 12,14, which are e.g. made from copper or aluminum and covered with a thin e.g. gold or platinum coating, which permits the transformation of the ions of the fluid into electrons.

Initially, the switch 20 is open and the switches 24,26 closed. Thus, the two coils 16,18 are connected in parallel and the current from the electrodes 12,14 is the same in each of them. As the coils are identical and traversed by identical currents in opposite directions, the magnetic fields produced by each of them are identical, but of the opposite sense. The magnetic field resulting from the simultaneous propagation of a current from the electrodes in the coils is zero.

Therefore the magnetometric transducer 28 only measures the local magnetic field, which is recorded and stored by the analysis and processing means 32.

Then, the switches 24 and 26 are opened, whereas the switch 20 is closed. The first coil traversed by a current from the electrodes 12,14 produces a magnetic field, which is superimposed on the local magnetic field.

Controlled by the analysis and processing means 32, the power supply 22 supplies a current having an intensity such that the magnetic field produced by the second coil 18 cancels out the magnetic field produced by the first coil 16 under the effect of the current from the electrodes 12,14.

When the magnetic field measured by the magnetometric transducer 28 is equal to the value of the local magnetic field recorded, the intensity of the current delivered by the power supply is equal to the intensity of the current flowing through the first coil. The electric/magnetic transfer rate of the coils is known, so that it is possible to deduce the value of the current flowing through the first coil 16, said current being equal to the surface current density J multiplied by the surface S of an electrode.

As the surface S of the electrodes is known, it is possible to deduce the electric field E of J by means of Ohm's law:

$$J = \sigma E$$

in which $\sigma$ is the known or measured conductivity of the conductive medium in question.

FIG. 2 diagrammatically shows an apparatus functioning in a similar manner to that described hereinbefore, but making it possible to obtain a better signal to noise ratio. A first coil 16a and a second coil 18a having a common geometrical center $C_a$ are wound in the same way as in the embodiment of FIG. 1.

A third and a fourth-coils 16b,18b are wound in such a way that the third coil 16b creates an identical magnetic field but in the opposite sense to the field created by the coil 16a, when an identical current flows through the latter. The first and third coils have an identical longitudinal axis.

The fourth coil 18b, having the same longitudinal axis AL and the same geometrical center Cb as the third coil 16b is able to create an identical magnetic field, but having the opposite sense to that created by the third coil 16b, when an identical current flows through the latter.

The second and fourth coils 18a,18b are connected in series with one another and the randomly regulatable power supply 22. Therefore the switch 20 makes it possible to switch on at random the power supply 22.

Switches 24,26 respectively connected to points A1,A2 and B1,B2 permit the connecting in parallel of the assembly of the first and third coils 16a,16b and the assembly of the second and fourth coils 18a,18b.

A first magnetometric transducer 28a is placed within the first coil 16a and a second magnetometric transducer 28b is placed within the third coil 16b.

As will be shown hereinafter, the second magnetometric transducer 28b can be located outside the third coil 16b if it is located in the vicinity (from 1 cm to 1 m, as a function of the transducer size) from the first magnetometric transducer 28a for precise measurements. In general, the second transducer can be several km away.

The apparatus also comprises means 30a,30b for controlling the transducers 28a,28b and analysis and processing means 32 connected to the transducers 28a,28b and to the power supply 22. The analysis and processing means 32 form a difference between the measurements performed by the first transducer 28a and those performed by the second transducer 28b.

The two-stage operation is identical to that described relative to the previous embodiment. Firstly, by connecting in parallel the two assemblies of coils, it is possible to measure and record a local magnetic field gradient, which makes it possible to obtain a stable, local magnetic field gradient reference. Then, by using the power supply 22 and with the switch 20 closed and the switches 24,26 open, the value of the total magnetic field is lowered until the previously recorded gradient value is found. The difference formed between these magnetic field measurements in opposite senses makes it possible to double the significant signal and therefore improve the sensitivity of the measurement.

The apparatuses shown in the previous drawings use magnetometric transducers, which can be of all random types. The choice of the transducer type is dependent on the particular performance characteristics desired by the user. In the case of NMR transducers, they can be connected in different known ways, namely as a nuclear oscillator, the output of the transducer being looped onto the input and measurement performed by a frequency meter, or as a nuclear filter with exploitation of the phase curve, the measurement being performed by a phase meter.

The apparatus shown in FIG. 2 can also function by using a switching procedure for the transducers 28a,28b, the analysis and processing means 32 then having a synchronous detection means 34 operating at the switching frequency.

The aforementioned apparatuses only supply the value of the electric field for a given direction, which is that of an axis perpendicular to the electrodes. FIG. 3 diagrammatically shows an apparatus according to the invention making it possible to determine two perpendicular components of the electric field.

The apparatus shown has an insulating enclosure 10 which is now e.g. cubic instead of cylindrical and having on its two opposite faces the electrodes 12 and 14 for the channelling of a first current density and on the two other opposite faces the electrodes 40,42 for channelling a second current density.

The set of coils 16a,18a,16b,18b provided with the switches 24,26 and the power supply 22 connected via the switch 20 is identical to that described with reference to FIG. 2. This set of coils is connected to the electrodes 12,14.

The set of coils 44a,46a,44b,46b provided with the switches 48,50 and the power supply 52 connected via the switch 54 is also identical to that described with reference to FIG. 2. This set of coils is connected to the electrodes 40,42.

A first magnetometric transducer 28 is placed within the coil 16a, whilst another transducer 56 is placed within the coil 4a.

The transducer 28 makes it possible to determine the magnetic field produced by the current density channelled by the electrodes 12,14, whereas the transducer 56 makes it possible to determine the magnetic field produced by the current density channelled by the electrodes 40,42.

In order to obtain a local magnetic field gradient, a magnetometric transducer 58 is placed in the vicinity of the transducers 28 and 56. This transducer 58 is connected in common for the determination of the local magnetic fields as a result of projections of the measurement of the magnetic field performed by the transducer 58 in the two considered directions.

The transducers 28,56,58 are controlled by control means respectively 30,57,60, which supply the necessary excitation signals for the operation of the transducers.

The transducers 28,56,58 are also connected to analysis and processing means 32 permitting the determination of the electric fields in one or other direction in accordance with an operating procedure identical to that described relative to FIGS. 1 and 2, i.e. essentially by applying Ohm's law to the current obtained as a result of the measurement of the magnetic fields in the considered directions.

Obviously, the apparatus according to the invention is not limited to applications in marine media and can also be used for electromagnetic measurements in other media, e.g. in drilling, where the conductive medium is constituted by the mud and in the electrochemical field for the analysis of corrosion phenomena.

We claim:

1. A process for measuring an electric field in a conductive medium, said process comprising the following steps:
    A) channeling a current density flowing through a volume of the conductive medium,
    B) inducing a magnetic field from said channeled current density,
    C) measuring said induced magnetic field,
    D) deducing the electric field in the volume of the considered conductive medium from the measurement of said induced magnetic field,
    wherein prior to step A, measuring the local magnetic field and/or the gradient of the local magnetic field and, for measuring the magnetic field induced by said current density, (step C),
    measuring the value of the total magnetic field or of the gradient of the total magnetic field, and compensating the induced magnetic field or the gradient of the induced magnetic field by the induction of an identical magnetic field, which has the opposite direction, so as to obtain the value of the local magnetic field only or the gradient of the local magnetic field.

2. Apparatus for measuring an electric field in a conductive medium, said apparatus comprising an insulating enclosure (10), means (12,14) for channeling a current density propagating in the medium and which are integral with the enclosure (10), at least one first coil (16, 16a) in the enclosure and connected to the means (12,14) for channeling a current density to receive current therefrom, said coil having a known electric/magnetic transfer rate, at least one first magnetometric transducer (28,28a) located within said first coil (16) for measuring the magnetic filed induced by current in said first coil, means (30,30a) for exciting said magnetometric transducer (28, 28a) and analysis and processing means (32) including storage means and connected to the magnetometric transducer (28) in order to at least determine an electric field.

3. Apparatus according to claim 2, including a second magnetometric transducer (28b) positioned in the vicinity of the first magnetometric transducer (28a) and connected to the analysis and processing means (32), said analysis and processing means being able to form a difference between the measurements performed by the first and second magnetometric transducers, and means (30b) for exciting said second magnetometric transducer.

4. Apparatus according to claim 2, including a second coil (18a) in said enclosure and having the same longitudinal axis and the same geometrical center ($C_a$) as the first coil (16a), so that said second coil creates an identical magnetic field, but having the opposite direction to the field created by the first coil (16a) when an identical current flows through said first and second coils, an at will variable supply (22) connected to said second coil and connection means (24,26) for the parallel connection, at will, of the first and second coils.

5. Apparatus according to claim 3, including a second coil (18a) in said enclosure and having the same longitudinal axis (AL) and the same geometrical center ($C_a$) as the first coil (16a), so that said second coil creates an identical magnetic field, but having the opposite direction to the field created by the first coil when an identical current flows through said coils, a third coil (16b) in said enclosure and able to create an identical magnetic field, but having the opposite direction to the magnetic field created by the first coil (16a) when an identical current flows through said coils, said third coil (16b) being connected in series, on the one hand to the first coil (16a) and on the other to the channeling means (12, 14), a fourth coil (18b) in said enclosure and having the same longitudinal axis (AL) and the same geometrical center ($C_b$) as the third coil (16b) and able to create an identical magnetic field, but having the opposite direction to the magnetic field created by the third coil when an identical current flows through said coils; said fourth coil (18b) being connected in series to the second coil (18a), connection means (24, 26) for the parallel connection, at will, of the assembly formed by the first and third coils to the assembly formed by the second and fourth coils and an at will variable current supply (22) connected on the one hand to the second coil and on the other to the fourth coil.

6. Apparatus according to claim 5, wherein the second transducer (28b) is located within the third coil (16b).

7. Apparatus according to claim 5, wherein the first and second magnetometric transducers (16a, 18a) are alternatively switched, the analysis and processing means (32) having synchronous detection means (34) which operates at the switching frequency.

8. Apparatus for measuring an electric field in a conductive medium, said apparatus comprising at least two apparatuses according to claim 5 for determining two components of the electric field, each of the apparatuses according to claim 5 being connected to means (12,14,40,42) for channelling a different current density.

9. Apparatus according to claim 8, wherein the second magnetometric transducer is common to the two apparatuses for determining said two components of the electric field.

* * * * *